United States Patent [19]

Kaito

[11] Patent Number: 5,376,883
[45] Date of Patent: Dec. 27, 1994

[54] ANALYSIS OF INTEGRATED CIRCUIT OPERABILITY USING A FOCUSED ION BEAM

[75] Inventor: Takashi Kaito, Tokyo, Japan
[73] Assignee: Seiko Instruments Inc., Tokyo, Japan
[21] Appl. No.: 984,921
[22] Filed: Dec. 4, 1992
[30] Foreign Application Priority Data
  Dec. 4, 1991 [JP] Japan .................................. 3-320793
[51] Int. Cl.⁵ ............................................ G01R 31/28
[52] U.S. Cl. .................................... 324/158.1; 324/501
[58] Field of Search ............... 324/158 R, 501, 158 D; 437/8; 250/310, 311

[56] References Cited

U.S. PATENT DOCUMENTS

| | | | |
|---|---|---|---|
| 4,578,279 | 3/1986 | Zingher | 324/501 |
| 4,629,898 | 12/1986 | Orloff et al. | 324/158 D |
| 4,686,466 | 8/1987 | Feuerbaum et al. | 324/158 R |
| 5,053,699 | 10/1991 | Aton | 324/158 R |

Primary Examiner—Ernest F. Karlsen
Attorney, Agent, or Firm—Spensley Horn Jubas & Lubitz

[57] ABSTRACT

A method and apparatus for analyzing the operability of a semiconductor integrated circuit without removing a passivation film formed on a surface of the circuit and also for analyzing causes of failure of such circuit. The integrated circuit wiring receives an AC test signal and a predetermined portion of the surface of the circuit is simultaneously scanned and irradiated with a focused ion beam while the portion is irradiated with an electron beam to neutralize charges produced by the ion beam irradiation. Then, secondary electrons which are released from the surface of the circuit as a result of the focused ion beam irradiation are detected, and the detected signals are matched with a scanning signal to display an image of the semiconductor integrated circuit.

4 Claims, 1 Drawing Sheet

ANALYSIS OF INTEGRATED CIRCUIT OPERABILITY USING A FOCUSED ION BEAM

BACKGROUND OF THE INVENTION

The present invention relates to a method and apparatus for analyzing the operability, or physical integrity, of a semiconductor integrated circuit by irradiating the semiconductor integrated circuit with a focused ion beam and detecting secondary electrons generated by the irradiation.

Japanese Patent Provisional Publication No. 142825/88 discloses one of the conventional methods for analyzing the operability of a semiconductor integrated circuit by irradiating the integrated circuit with a focused ion beam and detecting secondary electrons generated by the irradiation. This method is performed on an integrated circuit having wirings placed on a substrate, the wirings and the substrate being covered with a passivation film. A desired wiring is selected from among the substrate wirings and the selected wiring is irradiated with the focused ion beam in order to make holes in the passivation film and expose a predetermined portion of the wiring.

Next, while an area including the exposed portions of the wiring is irradiated with the focused ion beam, metal electrodes are formed around the holes by a CVD method using the focused ion beam. Then, the metal electrodes are irradiated with the focused ion beam, which causes secondary electrons to be released from the electrodes. The secondary electrons are detected and a potential waveform of the secondary electrons is measured in order to analyze the operation of the semiconductor integrated circuit.

The focused ion beam is deflected to perform a scanning movement during which the beam irradiates the specific area. Further, the CVD method using the focused ion beam refers to a method for making a film by the following steps: a desired portion is irradiated, while being scanned, with the focused ion beam, and at the same time, vapor of an organic compound is directed to the scanned portion; and then, part of the organic compound is adsorbed into the portion and is decomposed by the focused ion beam, and thereby forms the film. Generally in the process of forming electrodes, tungsten carbonyl is used as the organic compound vapor and metal electrodes of tungsten are formed.

However, in the conventional method, analyzing the operability of the semiconductor integrated circuit is often carried out by guessing fault points which cause a failure of the semiconductor integrated circuit and diagnosing a cause of the failure, or by tracing a cause if an unexpected mode of operation is observed. Moreover, a semiconductor integrated circuit to be analyzed for its operability is generally covered with a passivation film composed of an insulating film, so that the following steps are taken to analyze the operation of the semiconductor integrated circuit by detecting the secondary electrons generated by the irradiation of the focused ion beam:

selected portions of the wiring are exposed by making holes in the passivation film covering the wirings, and new electrodes are formed around the exposed portions of the wiring; and then the electrodes are irradiated with the focused ion beam to analyze the operation of the semiconductor integrated circuit.

In the above case, a guess is made in advance as to the location of fault points and holes are made above or in the vicinity of the assumed fault points on the passivation film before irradiation with the focused ion beam for the purpose of analyzing the operation of the semiconductor integrated circuit. Therefore, if a failure of the circuit cannot be detected at the measurement points, it is necessary to make holes in other portions of the passivation film and analyze the operation again. In other words, the conventional method involves a trial and error approach which requires a substantial amount of work.

SUMMARY OF THE INVENTION

It is an object of the present invention to provide improved method and apparatus for analyzing the operability of an integrated circuit.

In order to achieve the above, and other objects to be discussed herein, the present invention provides a method and apparatus for analyzing the operability of an integrated circuit with a focused ion beam. In this invention, an AC signal is applied to a portion of a semiconductor integrated circuit which is to be analyzed from outside the circuit, a specific area including the portion to be analyzed is simultaneously scanned and irradiated with the focused ion beam, and at the same time, the semiconductor integrated circuit is irradiated with an electron beam. Secondary electrons are generated from the semiconductor integrated circuit by the irradiation with the focused ion beam. Then, the secondary electrons are detected, and an image of the semiconductor integrated circuit is displayed on a display according to the intensity of the secondary electrons detected.

The passivation film composed of an insulating film covers the wiring of the semiconductor integrated circuit which is supplied with negative charges. The potential of the wiring appears at surface regions of the passivation film which are above the wiring because of electrostatic induction (dielectric polarization); that is, the surface of the passivation film has negative potential. Secondary electrons are released by irradiating the surface with the focused ion beam, and the secondary electrons are accelerated by the negative surface potential and detected by a secondary electron detector. On the other hand, the surface of the passivation film covering the wiring to which positive charges are applied has positive potential. Secondary electrons which are released by irradiating the surface with the focused ion beam are captured in the surface by the surface potential (positive potential), so that secondary electrons are scarcely detected by the secondary electron detector. Thereby, the state of the wiring potential in the semiconductor can be observed on a display.

However, as the passivation film provided on the surface of the semiconductor integrated circuit is an insulating film, the film is readily charged to a positive potential and the secondary electrons are captured in the surface. Therefore, the secondary electrons are scarcely detected by the secondary electron detector. In other words, the entire portion to be analyzed by the irradiation of the focused ion beam is charged with positive potential and no secondary electrons are released. As a result, it is impossible to observe contrast of the wiring potential of the semiconductor. Further, such charging occurs on the entire passivation film which is irradiated with the focused ion beam.

Accordingly, in the inventive method, the surface of the semiconductor integrated circuit is irradiated with a primary electron beam. Then, the portion charged with the positive potential by the irradiation with the focused ion beam captures the first electron beam or secondary electrons generated by the irradiation with the primary electron beam, and is neutralized, and thereby the charging is resolved. Therefore, it depends on the potential of the wiring under the passivation film which secondary electrons are detected by the secondary electron detector among the secondary electrons generated by the focused ion beam irradiation. Namely, the potential of the wiring of the semiconductor integrated circuit can be displayed on the display.

Further, the semiconductor integrated circuit is supplied with an AC signal. This is because when the circuit is supplied with a DC signal, a surface potential of the passivation film polarized by the potential of the wiring is neutralized by the focussed ion beam irradiation, the electron beam irradiation for neutralization and the secondary electrons generated by that irradiation as time passes, and a potential contrast on the passivation film surface is resolved.

Therefore, an electric signal that is applied to the semiconductor integrated circuit must be an AC signal.

Further objects, features and advantages of the invention will appear fully from the following description.

DESCRIPTION OF THE PREFERRED EMBODIMENTS

Embodiment 1

Figure 1:
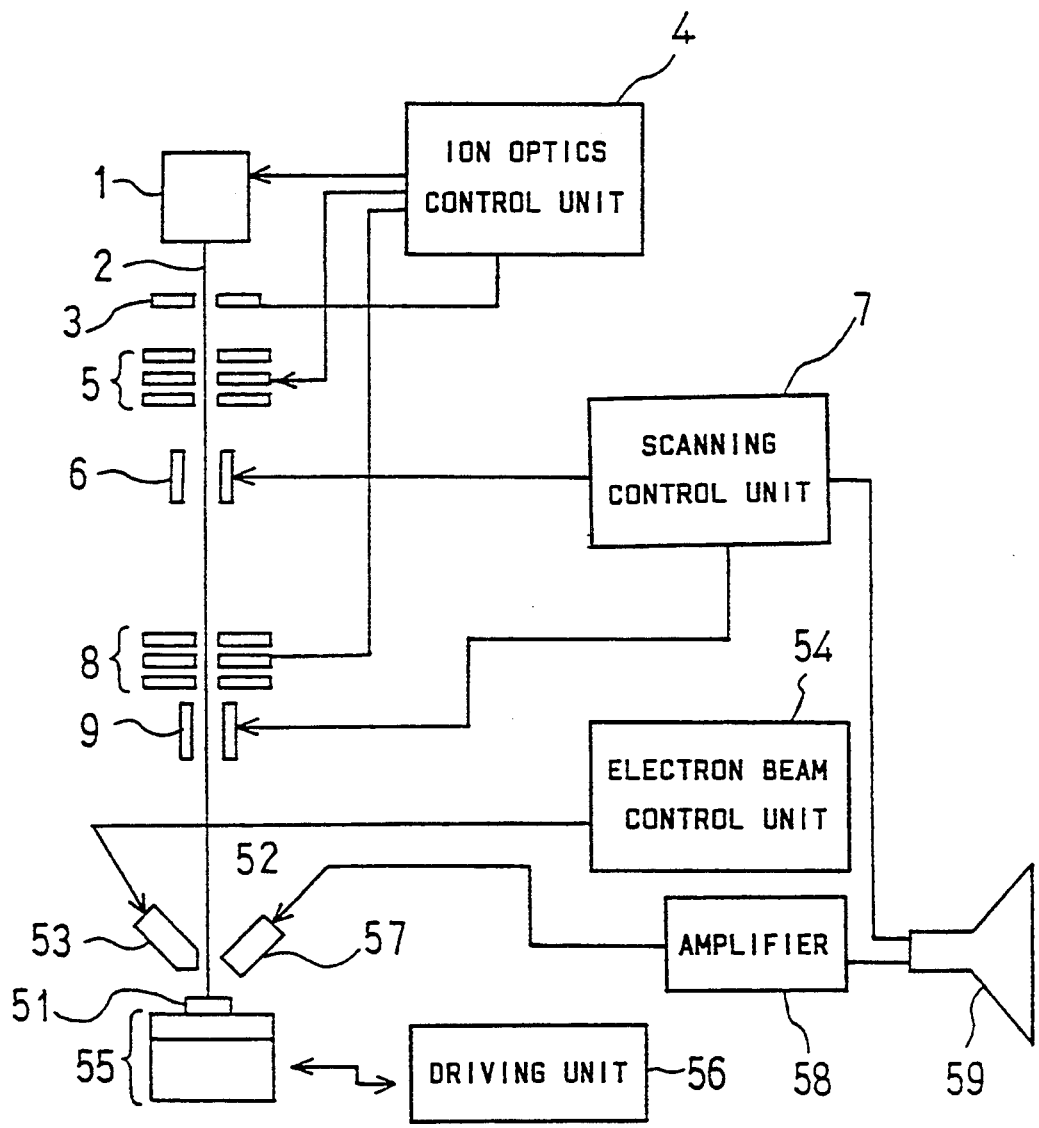
FIG. 1 is a partly schematic and partly simplified cross-sectional view of an embodiment of the present invention.

This invention will be further explained by reference to FIG. 1 showing a focused ion beam device for analyzing the operability of an integrated circuit.

A liquid metal ion source 1 using gallium (Ga) as the metal generates a Ga ion beam 2. In the direction in which ion beam 2 is emitted from liquid metal ion source 1, there is provided a beam monitor 3 which is in the form of a disk and has a hole at its center for passage of ion beam 2. Beam monitor 3 blocks those portions of ion beam 2 which have deviated from the optical axis of source 1 and simultaneously detects the current represented by those ion beam 2 which have been blocked. A signal representing the current detected by beam monitor 3 is transferred to an ion optics control unit 4, to control the output of liquid metal ion source 1.

Beneath beam monitor 3, a condenser lens 5 is disposed. A hole is also formed at the center of condenser lens 5 for letting the ion beam 2 pass and the ion beam 2 is focussed while passing through the hole. The focussing action of condenser lens 5 is also controlled by the ion optics control unit 4.

After the ion beam 2 passes through condenser lens 5, a blanker, or electronic shutter, 6 provided downstream of condenser lens 5 selectively blocks ion beam 2 or permits beam 2 to pass to a sample, such as integrated circuit 51. The blanker 6 is used when the ion beam 2 should not irradiate the sample. The blanker 6 is controlled by a scanning control unit 7.

The ion beam 2 which has passed through the blanker 6 is further focussed by an objective lens 8 disposed therebeneath and becomes a focused ion beam 52. The objective lens 8 is also controlled by the ion optics control unit 4.

Further, the focused ion beam 52 is deflected by a deflection electrode 9 provided under the objective lens 8. The scanning control unit 7 controls electrode 9 in order to control scanning of a target surface, or sample, by focused beam 52 with respect to scanning area, frequency, and time of scanning.

The focused ion beam 52, which is focused and scanned as mentioned above, irradiates a selected portion of sample 51. At the point where beam 52 strikes sample 51, beam 52 is preferably narrowed to a diameter of $1\mu$ or less by the two lenses 5 and 8. The acceleration voltage of ion beam 2 can range from 10 kV to 50 kV, and a voltage of 30 kV is preferably used in this embodiment. Further, current of the focused ion beam 52 can be set between several pA and several nA. A current level of 100 pA is used in the preferred embodiment.

The device further includes an electron beam irradiation unit 53 for irradiating the sample 51 with a second electron beam 60 in the vicinity of beam 52. The acceleration voltage, current level and beam diameter of electron beam 60 are controlled by an electron beam control unit 54. The electron beam 60 is used to irradiate the sample 51 when the sample 51 is also being irradiated with the focused ion beam 52 in order to prevent the passivation film which covers the sample surface from being charged with positive potential. The acceleration voltage of electron beam 60 should be 2 kV or less and is preferably set at around 500 V, because the passivation film will be charge by irradiation with the electron beam if the acceleration voltage exceeds 2 kV. In this embodiment, the acceleration voltage of 400 V is preferred.

Sample 51 is mounted on a sample stage 55, and further the sample stage 55 is associated with a drive unit 56 for displacing sample stage 55 in x, y and z directions. Sample stage 55 is provided with a connector having electric signal terminals for connection to sample 51.

Figure 2:
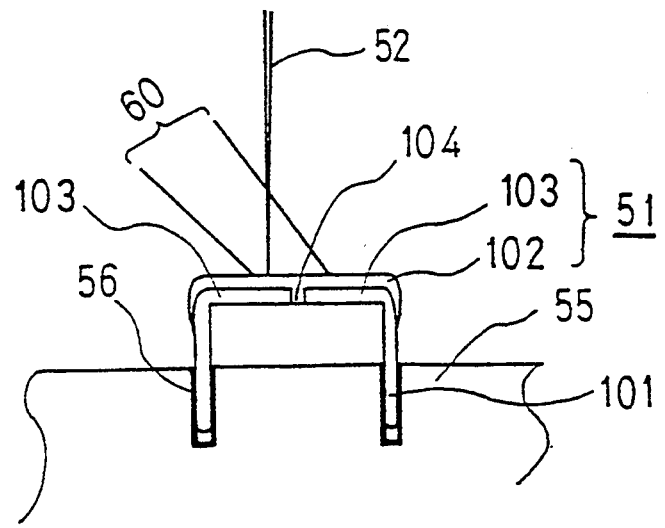
FIG. 2 is a simplified cross-sectional view of a sample which can be analyzed according to the invention.

In further detail, sample stage 55 has a structure as shown in FIG. 2. The connector is sample stage 55 is a socket 56 having terminals, including at least one signal output terminal, connected to pins 101 provided on the semiconductor integrated circuit which constitutes sample 51. The signal output terminal of socket 56 outputs an AC signal which serves as an input signal to the semiconductor integrated circuit.

The electric signal output terminal is not limited to the socket 56 shown in FIG. 2, but any means for outputting an AC signal to a specified circuit in any semiconductor integrated circuit is available, such as, for instance, a probe.

A secondary electron detector 57 is disposed at an appropriate location for detecting secondary electrons generated at the surface of sample 51 in response to irradiation by focused ion beam 52, for which purpose a window of detector 57 faces toward the surface of sample 51 which is irradiated by beam 52. A signal from the secondary electron detector 57 is amplified by an amplifier 58 and outputted into a display 59. A scanning signal from scanning control unit 7 is also inputted into the display 59, so that the intensity of the secondary electrons can be displayed on the display by matching a signal from the secondary electron detector 57 with the scanning signal from the scanning control unit 7.

Next, explanation will be given about the method for analyzing the operability of the sample 51 having an operation failure.

As shown in FIG. 2, a passivation film 102, which is an insulating film, is formed on the surface of sample 51. Under the passivation film 102, a wiring 103 has been formed, and a discontinuity, or wiring break, 104 which causes an operation failure exists in a part of wiring 103. For testing purposes, an AC signal is inputted into the pin 101 shown on the right in FIG. 2 from the socket 56 in sample stage 55. The AC signal is interrupted at the discontinuity 104, and the AC signal is not transferred to a portion of the wiring which is to the left of the discontinuity portion 104. A voltage is applied to a portion on the right of wiring discontinuity 104. If negative charges are applied to the latter portion, the potential of the surface of the passivation film 102 covering the portion becomes negative.

Then, while the area including discontinuity 104 is scanned and simultaneously irradiated with the focused ion beam 52, the area is also irradiated with the electron beam 60. The secondary electrons generated by the irradiation with focused ion beam 52 are not captured by the sample 51 in the portion of the passivation film having negative potential on its surface, like the wiring 103 at the right of discontinuity 104, because that portion is of the same polarity. On the contrary, they are accelerated in the direction of the secondary electron detector 57, so that many secondary electrons are detected by secondary electron detector 57. The voltage is not transferred to the wiring 103 on the left of the discontinuity 104 because of the discontinuity. On the surface of that portion of the passivation film 102 which is to the left of the discontinuity, a change in potential caused by the potential of the wiring does not occur, and the focused ion beam irradiation generates secondary electrons of a general insulating film. That is, the image of the portion of the wiring 103 on the left of the discontinuity 104 becomes darker than that on the right of the discontinuity 104.

On the other hand, when positive charges are applied to the wiring 103 on the right of the discontinuity 104, a secondary electron image produced from the wiring on the right of the discontinuity 104 becomes darker. This occurs because the surface potential of that portion becomes positive as a result of dielectric polarization and the secondary electrons are captured in the surface because of the positive potential.

As explained above, the secondary electrons detected by the secondary electron detector 57 are amplified by the amplifier 58 and matched with the scanning signals from the scanning control unit 7, and thereby the image of the wiring is displayed on the display 59. In other words, a contrast is observed between the two sides of the image of the wiring 103 with the discontinuity 104 as a boundary. The image on the display 59 thus shows the location of discontinuity 104 which is the cause of the operation failure.

After the fault point is found, the area including the discontinuity 104 is repeatedly scanned and irradiated with the focused ion beam. Thereby, the irradiated portion is removed by an ion sputtering method, a cross section of the fault point is exposed and at the same time the cross section is observed.

In order to observe the cross section, the sample 51 can be tilted, the exposed cross section of the discontinuity 104 is irradiated with the focused ion beam 52, and the secondary electrons or secondary ions are detected.

The irradiation by the electron beam 60 is very important when the condition of a semiconductor integrated circuit covered with the passivation film 102 is analyzed by scanning and irradiating the circuit with the focused ion beam 52 at the same time. When an insulating material is irradiated with the focused ion beam 52, the irradiation causes the material to release neutral particles, secondary charged particles of electrons (negative potential) and ions (most of which have positive potential though some have negative potential), and others. As the number of electrons is far greater than the number of ions in these secondary charged particles, the insulating material is readily charged to a positive potential. Because of this positive charging, the secondary electrons are captured and therefore are scarcely detected by secondary electron detector 57. That is, the image of the integrated circuit constituting sample 51 is not displayed on the display 59. It is the electron beam 60 that neutralizes this charge. Electron beam 60 can irradiate either the irradiation area of the focused ion beam 52 or the vicinity of that area, because the neutralization can be carried out by getting the secondary electrons generated by irradiation with electron beam 60.

Embodiment 2

Next, another embodiment will be described. In the method mentioned above, while the sample 51 is continuously scanned by and irradiated with the focused ion beam 52, simultaneously sample 51 is also continuously irradiated with electron beam 60. However, in this embodiment, while the sample 51 is continuously scanned by and irradiated with the focused ion beam 52 sample 51 is irradiated with the electron beam 60 intermittently. The irradiation of the focused ion beam 52 onto sample 51 causes the surface of the sample to be charged, but this does not occur immediately. Therefore, when electron beam 60 irradiates sample 51 for a short time, even though the irradiation is ceased, it does not substantially affect the secondary electrons which are released by the irradiation of sample 51 with the focused ion beam 52. Then, the secondary electron detector 57 detects the secondary electrons released from the surface of sample 51, but delivers to display 59, through amplifier 58, only the signals produced by secondary electrons generated from the surface of sample 51 by irradiation with the focused ion beam 52. This method can prevent signals produced by secondary electrons generated by irradiation of sample 51 with electron beam 60 from deteriorating a SIN ratio of the signals which are generated when the sample is irradiated only with the focused ion beam 52. Therefore, the condition of the sample can be analyzed with high precision.

Embodiment 3

According to a further embodiment, while the sample 51 is intermittently irradiated with the focused ion beam 52, which is scanning sample 51, the sample is intermittently irradiated with the electron beam 60. In this case, beams 52 and 60 irradiate the sample separately. In other words, the irradiation by the focused ion beam 52 alternates with irradiation by electron beam 60. Further, the secondary electron detector 57 transfers to the display 59 through the amplifier 58 only the secondary electron signals generated during irradiation of sample 51 by focused ion beam 52. This embodiment can also prevent the signals of the secondary electrons generated by the irradiation of sample 51 with electron beam 60 from deteriorating a SIN ratio of the signals which are generated when the sample is irradiated only with the focused ion beam 52. Therefore, the operation of the sample can be analyzed with high precision.

As explained above, the present invention permits the operational state, or integrity, of the semiconductor integrated circuit covered with a passivation film to be observed without removing the passivation film and thus enables a fault point to be identified. Further, the cause of the fault can be cleared with the inventive device.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A method for analyzing the operability of a semiconductor integrated circuit provided with circuit wiring and covered with a passivation film, comprising the steps of:

applying an AC signal at a selected point of the circuit wiring;

irradiating a specific area of the integrated circuit to be analyzed with a focused ion beam by scanning the area with the ion beam, and irradiating the specific area of the integrated circuit with an electron beam during irradiation with the focused ion beam to neutralize charges generated by the focused ion beam;

detecting secondary electrons emitted from the semiconductor integrated circuit in response to irradiation with the focused ion beam; and displaying an image of the semiconductor integrated circuit on a display based on the intensity of the detected secondary electrons.

2. A device for analyzing the operability of a semiconductor integrated circuit, comprising:

a liquid metal ion source for producing an ion beam;

a lens disposed for forming the ions into a focused ion beam;

beam deflection means for irradiating a predetermined portion of a surface of the semiconductor integrated circuit with the focused ion beam while scanning the portion with the focused ion beam;

an electron beam irradiation unit for irradiating at least the predetermined portion of the surface of the semiconductor integrated circuit with an electron beam;

signal output means connected for supplying an AC signal to the semiconductor integrated circuit;

secondary electron detector means disposed for detecting secondary electrons emitted from the integrated circuit in response to irradiation with the focused ion beam; and display means connected to said secondary electron detector means for displaying an image of the circuit in response to a signal from secondary electron detector means and a signal from beam deflection means.

3. A method for analyzing the operability of a semiconductor integrated circuit covered with a passivation film, comprising the steps of:

applying an AC signal to a portion of the semiconductor integrated circuit;

irradiating a specific area of the integrated circuit to be analyzed with a focused ion beam by scanning the area with the ion beam irradiating the semiconductor integrated circuit intermittently with an electron beam during irradiation of the focused ion beam to neutralize charges generated by the irradiation with the focused ion beam, detecting secondary electrons emitted from the semiconductor integrated circuit in response to irradiation with the focused ion beam; and displaying an image of the semiconductor integrated circuit on a display based on the intensity of the detected secondary electrons produced by the ion beam irradiation.

4. A method for analyzing the operability of a semiconductor integrated circuit covered with a passivation film, comprising the steps of:

applying an AC signal to a portion of the semiconductor integrated circuit;

irradiating a specific area of the integrated circuit to be analyzed intermittently with a focused ion beam by scanning the area with the ion beam;

irradiating the semiconductor integrated circuit with an electron beam in alternation with the intermittent ion beam irradiation to neutralize charges generated by the irradiation with the focused ion beam;

detecting secondary electrons emitted from the semiconductor integrated circuit in response to irradiation with the focused ion beam; and displaying an image of the semiconductor integrated circuit on a display based on the intensity of the detected secondary electrons produced by the ion beam irradiation.

* * * * *